US008347243B2

(12) United States Patent
Bruneel

(10) Patent No.: US 8,347,243 B2
(45) Date of Patent: Jan. 1, 2013

(54) PARAMETERIZED CONFIGURATION FOR A PROGRAMMABLE LOGIC DEVICE

(75) Inventor: Karel Bruneel, Ghent (BE)

(73) Assignee: Universiteit Gent, Ghent (BE)

( * ) Notice: Subject to any disclaimer, the term of this patent is extended or adjusted under 35 U.S.C. 154(b) by 11 days.

(21) Appl. No.: 12/992,744

(22) PCT Filed: May 15, 2009

(86) PCT No.: PCT/EP2009/055918
§ 371 (c)(1),
(2), (4) Date: Nov. 15, 2010

(87) PCT Pub. No.: WO2009/138490
PCT Pub. Date: Nov. 19, 2009

(65) Prior Publication Data
US 2011/0078640 A1 Mar. 31, 2011

(30) Foreign Application Priority Data
May 15, 2008 (EP) .................................. 08156323

(51) Int. Cl.
G06F 17/50 (2006.01)
(52) U.S. Cl. ......... 716/104; 716/103; 716/116; 716/117
(58) Field of Classification Search .......... 716/103–104, 716/116–117
See application file for complete search history.

(56) References Cited

U.S. PATENT DOCUMENTS

| 6,130,551 | A * | 10/2000 | Agrawal et al. .................. 326/39 |
| 6,216,258 | B1 * | 4/2001 | Mohan et al. ................... 716/117 |
| 6,216,259 | B1 * | 4/2001 | Guccione et al. ............. 716/117 |
| 6,487,709 | B1 * | 11/2002 | Keller et al. ................... 716/117 |
| 6,848,086 | B2 * | 1/2005 | Teig et al. ...................... 716/103 |
| 6,883,147 | B1 * | 4/2005 | Ballagh et al. ................. 716/102 |
| 6,912,700 | B1 * | 6/2005 | Franco et al. .................. 716/103 |
| 6,964,029 | B2 * | 11/2005 | Poznanovic et al. ........... 716/105 |
| 7,415,681 | B2 * | 8/2008 | Tomar et al. ................... 716/104 |
| 7,620,942 | B1 * | 11/2009 | Ma et al. ....................... 717/136 |
| 7,714,610 | B2 * | 5/2010 | He .................................. 326/41 |
| 7,735,047 | B1 * | 6/2010 | Anderson et al. ............. 716/116 |
| 7,774,191 | B2 * | 8/2010 | Berkowitz et al. .............. 703/23 |
| 2003/0036894 | A1 * | 2/2003 | Lam ............................... 703/19 |

(Continued)

FOREIGN PATENT DOCUMENTS
WO 02/27982 A1 4/2002

OTHER PUBLICATIONS

Kim; "An Implementation of Fuzzy Logic Controller on the Reconfigurable FPGA System"; IEEE Transactions on Industrial Electronic, vol. 47, No. 3; Jun. 2000; pp. 703-715.*

(Continued)

Primary Examiner — Naum Levin
(74) Attorney, Agent, or Firm — Bacon & Thomas, PLLC

(57) ABSTRACT

The invention relates to a method and a tool for generating a parameterized configuration for a Field Programmable Gate Array from a Boolean function, the Boolean function comprising at least one parameter argument, comprising the steps generating at least one tunable logic block from the Boolean function and from at least one parameter argument, and mapping the at least one tunable logic block to the Field Programmable Gate Array. This is advantageous since a parameterized configuration can be generated faster than with conventional tools.

18 Claims, 8 Drawing Sheets

U.S. PATENT DOCUMENTS

2006/0097752 A1* 5/2006 Bhatti et al. .................... 326/40

OTHER PUBLICATIONS

International Search Report in PCT/EP2009/055918, Sep. 23, 2009.
EPO Search Report regarding European Patent Application EP 08 15 6323, Aug. 6, 2008.
Derbyshire, Arran et al., "Incremental Elaboration for Run-time Reconfigurable Hardware Designs", Int. Conf. Compilers Archit. Synth. Embedded Syst.; Cases 2006: International Conference on Compilers, Architecture and Synthesis for Embedded Systems; Cases 2006: International Conference on Compilers, Architecture and Synthesis for Embedded Systems, 2006, pp. 93-102, XP002491233.
Bruneel, Karel et al., "A Method for Fast Hardware Specialization at Run-Time", Field Programmable Logic and Applications, 2007. FPL 2007. International AL Conference on, IEEE, PI, Aug. 1, 2007, pp. 35-40, XP031159045.
Derbyshire, A et al., "Compiling Run-Time Parametrisable Designs", Field-Programmable Technology, 2002. (FPT). Proceedings. 2002 IEEE International Conference on Dec. 16-18, 2002, Piscataway, NJ, USA, IEEE, Dec. 16, 2002, pp. 44-51, XP010636508.
Guccione, Stevena et al., "Run-Time Parameterizable Cores", Field Programmable Logic and Applications; [Lecture Notes in Computer Science; LNCS], Springer-Verlag, Berlin/Heidelberg, vol. 1673, Jun. 19, 2004, pp. 215-222, XP019000732.

* cited by examiner

```
while (sharedResources()) {
  for each net n do {
    ripUpRouting(n);
    routeNet(n);
    updatePresentSharingCost(n);
  }
  for each vertex v in the circuit graph do {
    v.updateHistoryCost();
  }
}
```

FIG. 11

```
function routeNet(Net n) {
  n.routingTree=n.source;
  while (n.notAllSinksFound()) {
    initialize PQ with all nodes of n.routingTree() at cost 0;
    while (noSinkFound()) {
      current=PQ.lowestCostNode();
      for (Node n in current.fanouts()) {
        PQ.add(n, current.pathCost() + n.nodeCost());
      }
    }
    pathToSink = PQ.lowestCostNode();
    RT.add(pathToSink);
  }
}
```

FIG. 12

```
while (sharedResources()) {
  for each tcon n do {
    ripUpRouting(n);
    routeTcon(n);
    updatePresentSharingCost(n);
  }
  for each vertice v in the circuit graph do {
    v.updateHistoryCost();
  }
}
```

FIG. 13

```
function routeTcon(Tcon tcon) {
  for (Pattern pattern:tcon.patterns) {
    ripUpRouting(pattern);
    for (Net net:pattern.nets) {
      ripUpRouting(net);
      RouteNet(net)
      addNetRoutingToPattern(net,pattern);
      setUsedInPattern(net);
    }
    setUsedInTcon(pattern);
    resetUsedInPattern();
    addPatternRoutingToTcon(pattern,tcon);
  }
  resetUsedInTcon();
}
```

FIG. 14

|  | LUTs | Wires | Channel width |
|---|---|---|---|
| Conventional | 27 | 249 | 3 |
| TLUT | 13 | 120 | 2 |
| TCON | 0 | 55 | 1 |

Table 1

|  | LUTs | Wires | Channel width |
|---|---|---|---|
| Conventional | 64 | 514 | 3 |
| TLUT | 25 | 263 | 2 |
| TCON | 0 | 124 | 1 |

Table 2

PARAMETERIZED CONFIGURATION FOR A PROGRAMMABLE LOGIC DEVICE

The invention relates to combinational logic synthesis and in particular to a computer based method and apparatus for generating a parameterized part- or complete configuration for a programmable logic device from any digital circuit and a set of parameter inputs which is a subset of the circuit's inputs and to corresponding devices. The invention also relates to a method and apparatus for generating a part- or complete parameterized configuration for a programmable logic device from a Boolean function and a set of parameters which is a subset of the function's arguments and to corresponding devices.

TECHNICAL BACKGROUND

Programmable logic devices (PLDs), such as Field Programmable Gate Arrays (FPGAs), are generally used as building blocks in creating electronic circuit designs. A programmable logic device is a hardware component whose functionality can be configured.

A logic design is an abstract description of functionality that, when implemented in hardware, performs a predetermined function. Example logic designs include digital filters and multipliers. A logic design has input and output signals that can be connected to other logic designs.

Implementing a logic design on a PLD takes the steps of synthesis, placement and routing. As in the case of ASICs (Application Specific Integrated Circuits. i.e., fixed hardware) the implementation on a PLD can be performed entirely at design time, i.e., before the component is used. However, due to the inherent reconfigurability of static RAM-based FPGAs, this implementation can also be performed on the fly. This technique is called run-time hardware generation. However, conventional implementation tools are computationally very expensive which leads to a large implementation time and makes run-time hardware generation useless for most applications.

However, in many applications, subsequent data manipulations only differ in a small set of parameter values. For each set of parameter values, an optimized implementation can be generated that is smaller and/or faster than a general implementation that captures all parameter values at once. The overhead involved in generating optimized configurations on the fly with conventional tools is very big.

SUMMARY OF THE INVENTION

It is the object of the invention to provide a method and apparatus for generating a part or complete parameterized configuration for a programmable logic device from any digital circuit and a set of parameter inputs which is a subset of the circuit's inputs and/or to provide corresponding devices. More generally, it is also the object of the invention to provide a method and apparatus for generating a part or complete parameterized configuration for a programmable logic device from a Boolean function and a set of parameters which is a subset of the function's arguments and/or to provide corresponding devices.

An advantage of embodiments of the present invention is that it provides a possibility for generating a parameterized configuration for a programmable logic device (either a part thereof or complete configuration) wherein the run-time part of the hardware generation time is much shorter compared to conventional methods. Another advantage of embodiments of the present invention is that it provides a shorter reconfiguration time than conventional methods. Each of these advantages allow the run-time hardware generation to be applicable for a large class of applications.

It is an advantage of embodiments of the present invention that no full configuration data is to be provided or stored upfront for each possible configuration to be used for the programmable logic device, for allowing these configurations to be implemented with the programmable logic device.

The present invention provides a computer based method that generates a part or complete run-time parameterized configuration from a Boolean function and a set of parameters which is a subset of the function's arguments or from any digital circuit and a set of parameter inputs, which is a subset of the circuit's inputs. A parameterized configuration, which may also be referred to as a parameterizable configuration, is a configuration for a programmable logic device (e.g. an FPGA configuration) in which some of the configuration bits are expressed as a function of a set of parameters. Programmable logic devices (PLD's) are (re)configurable to achieve programmability rather than other ways of obtaining programmability. In particular the present invention relates to programmable logic devices with a rewritable configuration memory as found in SRAM-FPGA's. If the configuration bits are expressed as functions of a set of parameters, then generating an optimized configuration reduces to evaluating these functions. The generation can be done at run time, for example.

In an embodiment of the present invention a method is provided for automatically generating a part or complete parameterized configuration for a LUT-based programmable logic device such as an FPGA starting from a Boolean function and a set of parameters which is a subset of the function's arguments of from any digital circuit and a set of parameter inputs. These latter parameter inputs are a subset of the circuit's inputs. An intermediate aspect of the present invention is a Tunable LUT (TLUT) circuit. A Boolean function and a set of parameters which is a subset of the function's arguments or a digital circuit can automatically be mapped to such a TLUT circuit. A parameterized configuration can be generated from a TLUT circuit.

Accordingly, the above object is addressed by a method for generating a part or complete parameterized configuration for a programmable logic device from any digital circuit and a set of parameter inputs or from a Boolean function and a set of parameter arguments. The method comprises the following steps: generating a circuit description comprising at least one logic block having at least one parameter input, also referred to as a tunable circuit, from the Boolean function and from at least one parameter argument, and generating the part or complete parameterized configuration for the programmable logic device from the circuit description. The latter step may include mapping the tunable circuit to the programmable logic device. A tunable circuit contains a tunable logic block. A tunable circuit is a generalization of a TLUT circuit and a tunable logic block is a generalization of a TLUT.

A parameterized configuration is a programmable logic device configuration in which some of the configuration bits are expressed as a function of a set of parameters, called the tuning functions. Online specialization of a parameterized configuration means evaluating these tuning functions. Resources needed for evaluating closed form Boolean functions are much lower than resources needed by conventional synthesis tools.

The parameterized configuration is preferably generated in two steps: First, a Boolean function is mapped to a tunable circuit of which a tunable LUT (TLUT) circuit is one example. In a second step, this tunable circuit is mapped onto the target programmable logic device architecture, resulting in a parameterized configuration.

A tunable logic block may be referred to as a logic block having at least one parameter input. A tunable logic block is a logic unit with the functionality of a tunable version of a regular logic block, i.e. it is a regular logic block adapted such that one or more configuration bits are expressed as a function of the parameter inputs, also called the parameter values. These functions are called tuning functions of the tunable logic block. A TLUT circuit is an example of a tunable circuit. The tunable logic blocks in a TLUT circuit are called TLUTs. TLUTs are Look Up Tables (LUTs) in which at least one entry of the truth table depends on the parameter input signals.

According to another preferred embodiment of the invention, the method comprises the following steps: calculating a tuning function that comprises the functionality of a part of the Boolean function that is implementable in the tunable logic block. According to one embodiment, at least one of the decomposition functions represents a look up table.

For example, a so-called TLUT mapper starts from a 2-bound combinational circuit, which is preferably a Boolean circuit built of logic gates with maximally two inputs, and a subset of its input signals, the so-called parameter input signals, and produces a TLUT circuit. The input circuit can be generated from a Hardware Description Language (HDL) description with a standard synthesis tool. The parameter inputs are preferably provided by the circuit designer. It is further preferred that the TLUT mapper as used in this invention is based on conventional structural technology mappers.

According to another preferred embodiment of the invention, the step of mapping a Boolean function to a tunable circuit comprises the steps of decomposing the Boolean function so that every decomposition function can be implemented by a logic block of the target PLD, more particularly e.g. by conversion of a tunable logic block into a logic block, and calculating the tuning function for every tunable logic block from the corresponding decomposition function. As already stated above, the tuning functions are a closed form Boolean function of the parameter input signals. Online specialization of the parameterized configuration means evaluating these tuning functions.

If the target PLD is an FPGA with K-LUTs as logic blocks, the Boolean function can be mapped to a tunable K-LUT circuit. A K-LUT is a LUT with K inputs. This means that the method decomposes the Boolean circuit so that every decomposition function can be implemented by a tunable K-LUT. A tunable K-LUT can implement any Boolean function with K regular arguments and any number of parameter arguments.

According to one embodiment, at least one of the decomposition functions represents a connection. The method may comprise routing by generating a subgraph for each of the logic blocks having at least one parameter input and representing a connection so that no two subgraphs have common nodes.

According to another preferred embodiment of the invention, the step of decomposing the Boolean function so that every decomposition function can be implemented by a logic block of the target PLD or a tunable logic block of the target PLD comprises the steps representing the Boolean function as a directed acyclic graph, wherein a node represents a logic gate, an input signal, a parameter input signal or an output signal, calculating a subgraph covering of the directed acyclic graph so that the functionality associated with every subgraph can be implemented by a logic block of the target PLD or a tunable logic block of the target PLD.

In general, generating a TLUT circuit with at least one TLUT from the Boolean function and from the at least one parameter input signal can be done in various ways. However, according to a preferred embodiment of the invention, the step generating a TLUT circuit from the Boolean function and from the at least one parameter input signal comprises the steps of representing the Boolean function as a directed acyclic graph, wherein a node represents a logic gate, an input signal, a parameter input signal or an output signal, marking the nodes that are only dependent on parameter inputs, folding the marked nodes having a non-marked successor into the successor and duplicating the marked nodes with multiple fanouts, and repeating prior step until no marked nodes are left. In this context, a fanout is preferably a measure of the ability of a logic gate output signal to drive a number of input signals of other logic gates at the same time.

According to another preferred embodiment of the invention, the step of mapping the tunable circuit to the programmable logic device comprises the steps of generating a master configuration for configuring the programmable logic device at startup, and evaluating the tuning functions which are used by a configuration manager at run-time. This means that the tunable logic block's functionality is partially implemented by a logic block on the programmable logic device and partially by a tuning function that is evaluated by the configuration manager. Preferably, when a new configuration is needed, the tuning functions are evaluated for the new parameter values resulting in new configuration bits for the programmable logic device's logic blocks. Further, it is preferred that these configuration bits are then written to the configuration memory. Removing the tuning input signals and the associated connections from the tunable circuit results in the regular logic block circuit that needs to be implemented on the programmable logic device. This can be done with conventional place and route tools. After placement and routing all configuration bits can be extracted except those that are expressed by a tuning function, called tunable configuration bits. This enables the generation of the master configuration, a configuration wherein the tunable configuration bits are replaced by a dummy value. This master configuration can be used as a template to set the programmable logic device's configuration memory at system startup.

A programmable logic device router, such as a FPGA router, can generally swap the input signals of LUTs in order to improve routability. Once the assignment of signals to LUT input ports is known, the tuning functions can be extracted. In other words, a tuning function is a vector of Boolean functions, one for each entry in the LUTs truth table. These Boolean functions can be found by partially evaluating the functionality of the TLUT for every possible input combination of a K-LUT, which is a LUT with a fixed number, K, of normal inputs and a variable number of tuning inputs. K matches the number of inputs of the LUTs implemented on the target programmable logic device.

According to another preferred embodiment of the invention, the configuration manager is used for generating a configuration and for reconfiguring the programmable logic device with the configuration. In other words, the configuration manager performs the reconfiguration by evaluating the tuning functions as a reaction to its input signals. The configuration manager can range from a fairly simple system to a powerful computational platform. A simple system could for example read predefined configuration bits from a non-volatile memory and write these bits to the configuration memory. Preferably, a powerful system is used that also calculates the new configuration information starting from its current state and inputs.

According to another preferred embodiment of the invention, the tunable circuit comprises at least one logic block with at least one data input signal and at least one select input signal, wherein each combination of values of the at least one select input signal is coupled with at least one data input signal and wherein the value of the output signal of the logic block is equal to the value of the at least one data input signal coupled to the combination of values of the at least one select input signal.

According to a further preferred embodiment of the invention, the logic block with the at least one data input signal and/or the at least one select input signal is provided as a Look Up Table. Preferably, the data of a Look Up Table (LUT) is provided as a data structure, which is used to replace a runtime computation with a simple look-up operation. This decreases computational time, since retrieving a value of a memory is often faster than undergoing an expensive computation.

The present invention also provides a tool, e.g. a design tool, for generating a part or a complete parameterizable configuration for a programmable logic device from a Boolean function and a set of parameter arguments, the Boolean function comprising at least one parameter input signal, the tool comprising:
  a) first means for mapping a Boolean function to a circuit description comprising at least one logic block having at least one parameter input, also referred to as a tunable circuit, and
  b) second means for generating the part or complete parameterized configuration for the programmable logic device from the circuit description. The second means may include means for mapping the tunable circuit to a target programmable logic device architecture resulting in the parameterized configuration.

The tool includes additional means for implementing individual method steps of the present invention as detailed in the attached claims. The tool may be provided as a computer program or a set of software modules, e.g. stored in any suitable form of memory.

The present invention also relates to a device comprising a programmable logic device and a configuration manager for configuring the programmable logic device at run-time, the configuration manager being adapted for evaluating a part of or a complete parameterized configuration and reconfiguring the programmable logic device. The configuration manager thus may be adapted for generating a particular configuration based on a set of parameters and on a part of or a complete parameterized configuration for the programmable logic device based on a circuit description comprising at least one logic block having at least one parameter input and based on a Boolean function and a set of parameter arguments.

These and other aspects of the invention will be apparent from and elucidated with reference to the embodiments described hereinafter.

BRIEF DESCRIPTION OF THE DRAWINGS

In the drawings
FIG. 1 schematically depicts a TLUT circuit for a 4:1 multiplexer according to an embodiment of the present invention
FIG. 2 schematically depicts a design flow for mapping a TLUT circuit to a parameterizable configuration according to an embodiment of the present invention,
FIG. 3 schematically depicts a LUT circuit of the 4:1 multiplexer according to an embodiment of the present invention,
FIG. 4 schematically depicts a design flow for mapping an application to a tunable LUT circuit according to an embodiment of the present invention,
FIG. 5 schematically depicts a 2-bound directed acyclic graph (DAG) for the 4:1 multiplexer according to an embodiment of the present invention,
FIG. 6 schematically depicts an input DAG for a structural mapper of the 4:1 multiplexer according to an embodiment of the present invention,
FIG. 7 schematically depicts a mapping of the 4:1 multiplexer DAG according to an embodiment of the present invention.
FIG. 11 illustrates an example of a part of a pseudo code of an exemplary conventional basic algorithm for generating a configuration of a programmable logic device.
FIG. 12 illustrates an example of a part of the pseudo code of an algorithm for routing a net as can be used in a basic algorithm for generating a configuration based on tunable logic blocks, as can be used in embodiments of the present invention.
FIG. 13 illustrates an example of a part of the pseudo code of an algorithm for inducing a negotiated congestion loop, as can be used in a basic algorithm for generating a configuration based on tunable logic blocks, as can be used in embodiments of the present invention.
FIG. 14 illustrates another example of a part of a pseudo code of an exemplary basic algorithm for generating a configuration comprising tunable connections as tunable logic blocks, as can be used in embodiments of the present invention.

DETAILED DESCRIPTION OF THE PRESENT INVENTION

Figure 1:
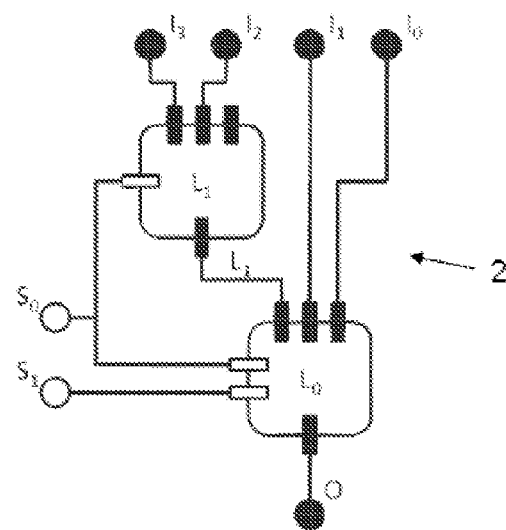

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Where in the present application reference is made to the term "configuration" or "configuration data", reference is made to the information that defines the functionality of a programmable logic device (PLD). Where in the present application reference is made to the term "parameter subset", reference is made to a subset of the input signals that define the specific functionality of the application to be implemented on the programmable logic device. In other words, the configuration or configuration data will be function of the parameter subset. With "parameter", reference may be made to an element of the parameter subset.

Where in the present application reference is made to a "tuning function", such a tuning function may be a Boolean function of a set of parameters, Where reference is made to a parameterisable configuration, a configuration is envisaged in which some of the configuration bits or configuration data elements are expressed as a tuning function.

Where in the present application reference is made to a "tunable logic block", this refers to a logic block having at least one parameter input. The logic block also may have a number of regular inputs rather than parameter inputs. The logic block may be representative for a look up table (LUT) as well as for a connection being a switch (or any other connection block) in the routing infrastructure of the programmable logic device.

Where in the present application reference is made to a tunable circuit, reference is made to a circuit description that comprises at least one tunable logic block. The description furthermore may comprise a number of regular blocks. The tunable circuit also may comprise a netlist describing the connections between these blocks. The tunable connections TCON thus may be represented by blocks. These may be connected to the blocks that represent logic by nets that form the netlist. In some embodiments, such nets may be point-to-point nets. Multi-point nets may be represented by TCONs.

A parameterized configuration, in the present application also referred to as a parameterizable configuration, thus is a programmable logic device configuration in which some of the configuration bits are expressed as a closed form Boolean function of a set of parameters; these functions are called the tuning functions. A parameterized configuration can easily be transformed to a regular configuration by evaluating its tuning functions for one specific set of parameter values.

Where in the present application reference is made to a tunable circuit, a tunable logic block, a tunable connection or a tunable look-up-table, reference is made to a tunable circuit description, a tunable logic block description, a tunable connection description or a tunable look-up-table description that can be implemented by the components of the PLD. The tunable circuit description, tunable logic block description, tunable connection description or tunable look-up-table description may be considered as functional components that can be implemented as structural components by the components of the PLD.

The present invention relates to configuring a programmable logic device (PLD) such as for example a field programmable gate array (FPGA). An FPGA is a digital component of which the functionality is determined by the content of its configuration memory. In particular the present invention relates to programmable logic devices with a rewritable memory like SRAM-based FPGAs. The content of this configuration memory can be changed by rewriting (i.e. reprogramming or reconfiguring) the configuration memory. The content of the configuration memory is called a configuration. A specific configuration (logic ones and zeros) written in the configuration memory implements a specific function in the FPGA. An aim of the present invention is to generate these configurations economically, given a particular functionality. Rather than selecting a full different configuration from a set of stored configurations, embodiments of the present invention may allow for generating a different configuration by determining parameter values for parameters in a parameterised configuration.

If it is known at design time that the functionalities (for which a configuration will have to be generated) only differ in a set of parameters, a parameterized configuration can be generated at compile time. This parameterized configuration contains the same amount of elements as regular configuration but now these elements are not all logical ones and zeros but they can also be functions of the parameters. A parameterized configuration has to be converted to binary form (containing only ones and zeros) before it is written to the configuration memory of an actual programmable logic device. This parameterized configuration can be converted rapidly into a regular configuration for specific parameter values by evaluating the Boolean functions in regard to the specific parameter values. Given a functionality (e.g. expressed as a set of parameter values) the present invention provides a method and apparatus for generating a parametized configuration for the FPGA. After the evaluation, a regular configuration is obtained that can be written to the configuration memory because every function in the parameterized configuration is replaced by a one or a zero. This can for example be used by systems that use dynamic reconfiguration to generate specialized configurations online. In this perspective the quality of a parameterized configuration can be expressed as the inverse of the energy needed to evaluate the tuning functions. This energy is proportional to the number of tuning functions and their average complexity. Embodiments of the present invention provide a method and apparatus for automatically generating such a parameterized configuration from a Boolean function and a set of parameter arguments (i.e. inputs), which are a subset of the functions arguments. According to embodiments of the present invention, the parameterized configuration may comprise configuration bits expressing look up tables (LUTs) as function of the parameters, configuration bits that control the switches in the routing infrastructure of the FPGA (connections, CON) or a combination thereof. The parameterized configuration may be expressed as a tunable circuit being a Boolean circuit representation. Such a Boolean circuit representation may comprise a first type of functional blocks being Tunable LUTs (TLUTs), a second type of functional blocks being Tunable Connections (TCONs) or a combination thereof. A tunable circuit may have a number of parameter inputs which are connected to the parameter inputs of the TLUTs and/or TCONs. The ports of the functional blocks may be connected using one to one connections. This can be done since a multi-sink net can always be implemented using a TCON.

It is an advantage of embodiments of the present invention that there is no need for running a conventional FPGA tool chain for every possible set of parameter values and deriving the tuning functions from the resulting regular configurations. The latter would result in truth table entries of the tuning function of one specific configuration bit which are nothing less than the Boolean values for that specific bit in each of the generated configurations. It is an advantage of embodiments of the present invention that the parameterized configuration exploits a possible correlation in the set of regular configurations, thus resulting in an improved quality of the resulting parameterized configuration.

Embodiments of the present invention make use of technology independent optimization to produce a 2-bound combinational circuit followed by a technology mapping step. In embodiments of the present invention a functional decomposition is carried out but instead of decomposing the function in sub-functions that can be implemented in a logic block of an FPGA (generally in LUTs), the present invention seeks for subfunctions that can be implemented in tunable logic blocks, which may be tunable look up tables (TLUTs), tunable connections (TCONs) or a combination thereof. These are tunable versions of the FPGAs logic blocks. A starting point is a Boolean function found in a logic synthesis step, i.e. via combinational logic synthesis and sequential logic synthesis.

Figure 10:
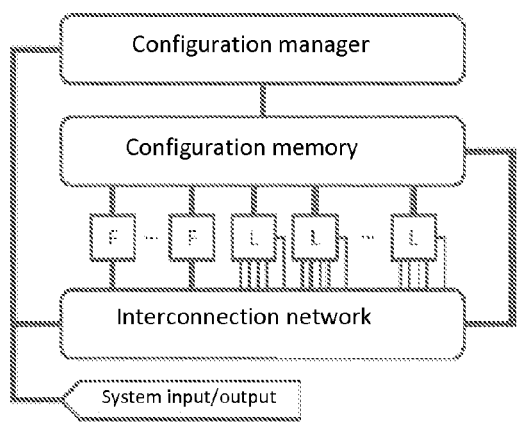
FIG. 10 schematically depicts reconfigurability by showing the configuration memory and a configuration manager according to an embodiment of the present invention.

A reconfigurable gate array model for mapping in accordance with embodiments of the present invention is shown schematically, see FIG. 10. The reconfigurability is reflected by showing a configuration memory and a configuration manager. The configuration bits are input signals to the configurable computational elements. In the following the invention will mainly be described with reference to LUTs unless indicated differently, but as indicated above the present invention is not limited thereto and includes other computational elements or an interconnection network, such as for example connections. The gate array model depicts a programmable logic device such as an FPGA as a collection of computational elements connected through an interconnection network. These computational elements can be a mix of memories, multipliers, flip-flops, . . . and configurable logic blocks. In the gate array model the interconnection network can implement random or arbitrary connections from its inputs (the outputs of the computational elements and the inputs of the programmable logic device, e.g. FPGA) to its outputs (the inputs of the computational elements and the outputs of the FPGA). The connections in a conventional gate array model are seen as fixed connections. As already indicated above, in programmable logic devices with a rewritable memory such as SRAM based FPGAs, the interconnection structure can also be reconfigured by writing to the configuration memory. This makes it possible for the configuration manager to change the connections on the FPGA, thus adding another level of computational power to the FPGA. Accordingly and as indicated above, the present invention applies to programmable logic devices with a rewritable memory such as SRAM based FPGAs in which the function implemented by a LUT and the connections in the interconnection network can be changed by rewriting the configuration memory under the control of the configuration manager.

The configuration manager performs the (re)configuration by (re)writing the configuration memory as a reaction to its inputs. These inputs can be system inputs, signals in the interconnection network or information read back from the configuration memory. The configuration manager can range from a fairly simple system to a powerful computational platform. A simple system could for example read predefined configuration bits from a non-volatile memory and write these bits to the configuration memory at system start-up. A powerful system could also calculate the new configuration information starting from its current state and inputs.

One way to implement this configuration manager could be in the form of a process on an ISP (Instruction Set Processor) that interfaces with the FPGA's configuration port.

According to a preferred embodiment of the invention, a parameterized configuration for a programmable logic device, such as a Field Programmable Gate Array (FPGA), is generated in two steps. First, a combinational circuit (1) is mapped to a Tunable LUT (TLUT) circuit (2). A TLUT circuit (2) is a static Look Up Table (LUT) circuit (3) in which the truth tables of some of the LUTs (3) depend on parameter inputs (4). In the second step, the TLUT circuit (2) is mapped onto a target programmable logic device architecture (e.g. FPGA architecture), resulting in a parameterized configuration. When referring to inputs, outputs or parameters in the further description, it is also meant that these are equal to input signals, output signals or parameter signals, respectively.

For the following description, a 4:1 multiplexer is used as an example for a preferred embodiment of the invention but the present invention is not limited thereto. The multiplexer has four data inputs (I0, I1, I2 and I4), two select inputs (S0 and S1) and one output (O) although the present invention is generally applicable to multiplexers independently of the number of inputs or outputs. According to a preferred embodiment of the invention, the select inputs (S0 and S1) are chosen as parameter inputs (4). Furthermore it is assumed for the sake of simplicity, that the LUTs (3) in the target FPGA fabric comprise three input LUTs (3).

A tunable LUT circuit (2) is an extension of a regular LUT circuit (3) that is produced by a technology mapping step in the conventional programmable logic device tool chain, e.g. FPGA tool chain. In contrast to regular LUTs (3) with K inputs, TLUTs (2) have K regular inputs and any number of tuning inputs. These tuning inputs are connected to the parameter inputs (4) of a circuit. As for regular LUTs (3), every TLUT (2) is associated with a Boolean function that expresses its output in function of its inputs (which for TLUTs is a combination of regular inputs and tuning inputs). A TLUT contains a tuning function and a regular LUT. The tuning function expresses the truth table of the regular LUT in function of the TLUT's tuning inputs.

FIG. 1 depicts a TLUT circuit (2) for the 4:1 multiplexer of the present example. Regular inputs and outputs are represented as filled circles while parameter inputs are not filled. Similarly, the regular input ports of the TLUTs (2) are filled and the tuning input ports are not. The Boolean functions associated with the TLUTs (2), for the multiplexer example, are given in the following equation:

$$O = FL0(S1, S0, I1, I1, I0)$$
$$= S1L1 + \bar{S}1(S0I1 + \bar{S}0I0)$$
$$L1 = FL1(S0, I3, I2)$$
$$= S0I3 + \bar{S}0I2$$

Figure 2:
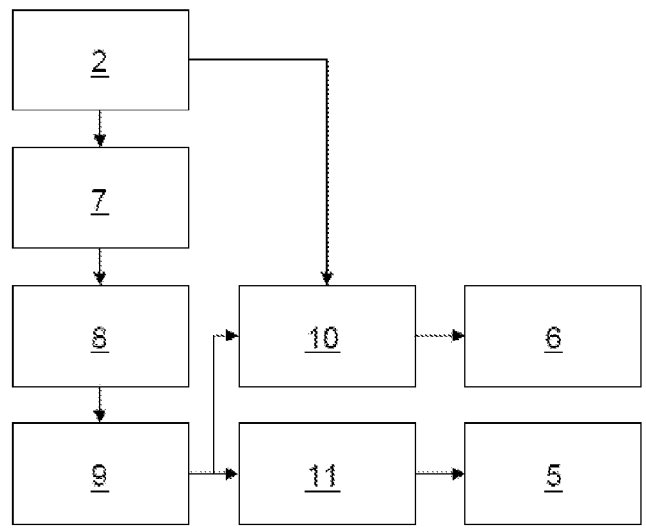

A design flow for generating a parameterized configuration by mapping a TLUT circuit (2) to a target hardware architecture is depicted in FIG. 2. It starts from a TLUT circuit (2) and produces a parameterized configuration, containing a master configuration (5) and a set of tuning functions (6). The master configuration (5) is used to configure the FPGA at startup and the tuning functions (6) are used by a configuration manager to generate specialized configurations at run-time.

The TLUT's (2) functionality is partially implemented by a LUT (3) on the programmable logic device, e.g. FPGA and partially by a tuning function (5) that is evaluated by the configuration manager. When a new configuration is needed, the tuning functions (5) are evaluated for the new parameter inputs (4) resulting in new truth tables for the FPGA's LUTs (3). These truth tables are then written to the configuration memory.

Figure 3:
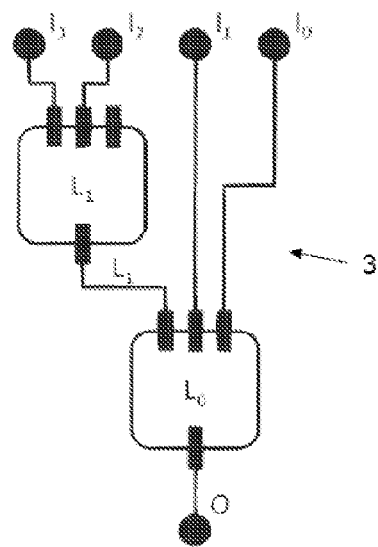

Removing the tuning inputs and the associated connections from the TLUT circuit (2), by extracting the LUT circuit (7), results in the regular LUT circuit (3) that need be implemented on the FPGA. The latter can be done with conventional place (8) and route (9) tools. FIG. 3 depicts a resulting LUT circuit (3) according to a preferred embodiment of the invention After placement (8) and routing (9), all configuration bits can be extracted except those that set the truth tables of the TLUTs. This results in the generation (11) of the master configuration (5), a configuration where the truth table bits are replaced by a dummy value. This master configuration (5) will be used as a template to set the FPGA configuration memory at system startup.

An FPGA router can generally swap the input signals of LUTs (3) in order to improve routability. Once the assignment of signals to LUT (3) input ports are known, the tuning functions (6) can be extracted (10). A tuning function (6) is a vector of Boolean functions, one for each entry in the LUT's (3) truth table. These Boolean functions are found by partially evaluating the functionality of the TLUT (2) for every possible input combination of a K-LUT. These are LUTs (3) with a fixed number, K, of normal inputs and a variable number of tuning inputs. K matches the number of inputs of the LUTs (3) implemented on the target FPGA.

For the present multiplexer example it is assumed that the router assigned the signals to the LUT (3) ports as depicted in FIG. 3 and that the ports are numbered from left to right. Partial evaluation of FL0 results in the tuning function (4) for L0, as per the following equations:

$$L0_t^0(S1, S0) = FL0(S1, S0, 0, 0, 0) = 0$$

$$L0_t^1(S1, S0) = FL0(S1, S0, 0, 0, 1) = \overline{S1}\,\overline{S0}$$

$$L0_t^2(S1, S0) = FL0(S1, S0, 0, 1, 0) = \overline{S1}S0$$

$$L0_t^3(S1, S0) = FL0(S1, S0, 0, 1, 1) = \overline{S1}$$

$$L0_t^4(S1, S0) = FL0(S1, S0, 1, 0, 0) = S1$$

$$L0_t^5(S1, S0) = FL0(S1, S0, 1, 0, 1) = S1 + \overline{S1}\,\overline{S0}$$

$$L0_t^6(S1, S0) = FL0(S1, S0, 1, 1, 0) = S1 + \overline{S1}S0$$

$$L0_t^7(S1, S0) = FL0(S1, S0, 1, 1, 1) = 1$$

A partial evaluation of FL1 results in the tuning function (6) for L1, as per following equations:

$$L1_t^0(S0) = FL1(S0, 0, 0) = 0$$

$$L1_t^1(S0) = FL1(S0, 0, 0) = 0$$

$$L1_t^2(S0) = FL1(S0, 0, 1) = \overline{S0}$$

$$L1_t^3(S0) = FL1(S0, 0, 1) = \overline{S0}$$

$$L1_t^4(S0) = FL1(S0, 1, 0) = S0$$

$$L1_t^5(S0) = FL1(S0, 1, 0) = S0$$

$$L1_t^6(S0) = FL1(S0, 1, 1) = 1$$

$$L1_t^7(S0) = FL1(S0, 1, 1) = 1$$

The tuning functions (6) are evaluated by the configuration manager; this can be any system capable of evaluating Boolean functions. Preferably the configuration manager is an instruction set processor (ISP). In this way, the tuning functions (6) will be transformed to a dedicated C function that takes the parameter values as inputs and outputs the truth tables of the LUTs (3).

Figure 4:
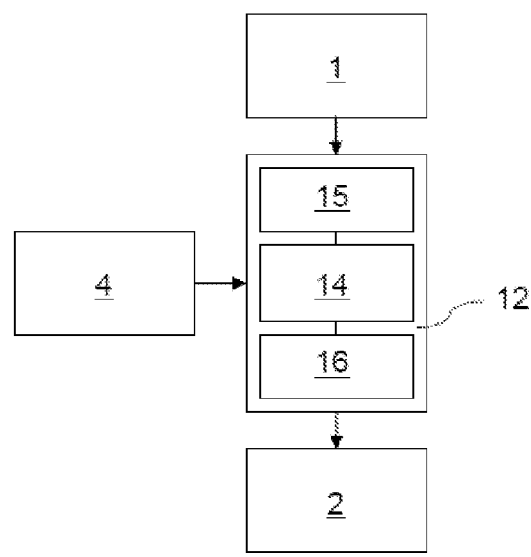

The design flow for mapping an application to a TLUT circuit (2) is depicted in FIG. 4. The TLUT mapper (12) starts from a 2-bound combinational circuit (1), which is a Boolean circuit built of logic gates with maximally two inputs, and a subset of its inputs, called parameter inputs (4), and produces a TLUT circuit (2). The input circuit can be generated from an HDL description with a standard synthesis tool, in which the circuit designer preferably provides the parameter inputs (4).

According to the preferred embodiment of the invention, the TLUT mapper (12) is based on conventional structural technology mappers (14). These structural mappers (14) represent a combinational circuit (1) as a directed acyclic graph (DAG) G=(V, E). A node in the graph v ∈ V represents a logic gate, a primary input or a primary output. A directed edge in the graph (u, v) ∈ E represents a connection in the logic circuit which is an input of gate v and an output of gate u. A cone of v, Cv, is a subgraph consisting of v and some of its predecessors that are not primary inputs, such that any node u ∈ Cv has a path to v that lies entirely in Cv. The set of input edges of a cone Cv is the set of edges with head in Cv and tail outside Cv, and the set of output edges is the set of edges with v as a tail. A cone is called K-feasible if the number of inputs is smaller than or equal to K. Structural technology mapping (14) tools select a set of K-feasible cones to cover the graph in such a way that every edge lies entirely within a cone or is an output edge of a cone. Each of these K-feasible cones can be implemented by a K-input LUT.

Figure 5:
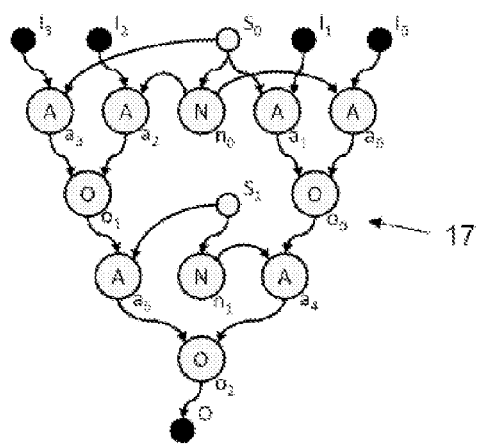

The 2-bound DAG of the 4:1 multiplexer (17) example is depicted in FIG. 5. Regular inputs and the outputs are represented as small filled circles (I0, I1, I2 and I3) while the parameter input (4) nodes are not filled (S0 and S1). For each internal node the associated gate is indicated (A for AND, O for OR, N for NOT).

The problem that needs to be solved by the TLUT mapper (12) is similar to the one solved by conventional structural mappers (14). So, instead of finding a set of K-feasible cones, a set of cones with up to K regular input edges and any number of input edges that have a parameter input (4) as tail must be found. This problem is solved in two ways: by adding a frontend (15) and a backend (16) to a conventional mapper (14) or by adapting a conventional mapper.

The frontend (15) takes the DAG of the combinational circuit (1) as input and transforms it into a new DAG. This takes two steps:

First, the nodes that are only dependent on parameter inputs (4) are marked. This can be done by marking the parameter inputs (4) and then recursively marking other nodes if all their predecessors are marked.

Second, the marked nodes that have a non-marked successor are folded into this successor. During this process marked nodes that have multiple fanouts are duplicated.

The second step is repeated until no marked nodes are left in the structure.

Figure 6:
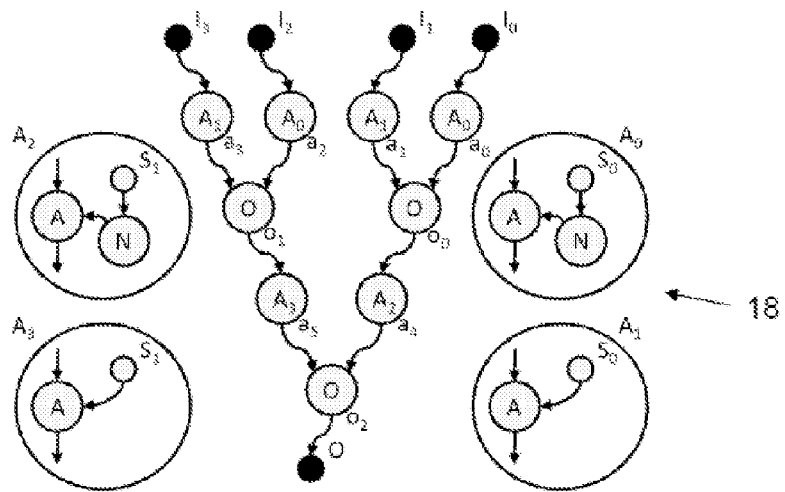

In the present example the two N-nodes (n0 and n1) and the two parameter inputs (S0 and S1) (4) are marked and folded into their successor nodes. The folded DAG (18) is depicted in FIG. 6.

Figure 7:
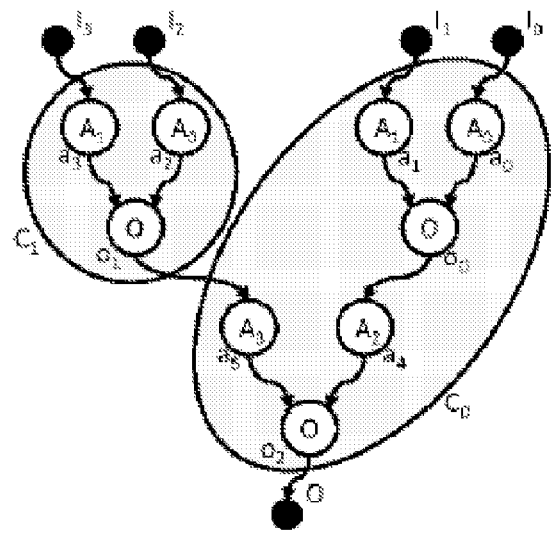

In the next step the folded DAG (18) is used as input for a conventional structural mapper (14) capable of mapping to the target FPGA. In the present example the target FPGA uses 3-LUTs. The result of the mapping (19) is depicted in FIG. 7. The folded DAG (18) is covered with two cones C0 and C1.

The backend (16) derives a TLUT circuit (2) from the result of the structural mapper (14). The parameter inputs (4) are extracted from the cones. This results in cones with regular input edges and input edges with a parameter input (4) as tail. Each of these cones can be implemented by a TLUT (2). The functionality of a TLUT (2) is found by analyzing the content of its associated cone. For the present example the TLUT circuit (2) is depicted in FIG. 1. Cone C0 is implemented by LUT L0 (3) and cone C1 is implemented by LUT (3) L1 (3). The final result is a TLUT circuit that can be implemented on the target FPGA using the method described before, see FIG. 2.

Adapting a conventional mapper is done in the following way. Structural mappers generally use the following steps to produce a cone covering of the input graph: cone enumeration, cone ranking and cone selection. During cone enumeration all K-feasible cones of every node in the DAG are enumerated. During cone ranking the best cone for each node is picked according to the mapping criterion. During cone selection a subset of the best cones are selected as the final covering of the graph. The only adaptation that needs to be made is in the cone enumeration step. Instead of enumerating all K-feasible cones of every node in the DAG, we enumerate all cones of every node in the DAG with up to K regular input edges and any number of input edges that have a parameter input as tail.

A cone of a node can be expressed with a cut, this is the set of nodes that drive the inputs of the cone.

During cone enumeration all cones of every node in the DAG with up to K regular input edges and any number of input edges that have a parameter input as tail are enumerated. This is preferably done with a dynamic programming algorithm that passes over all the nodes in topological order from the primary inputs and parameter inputs to the primary outputs. The cut set of the node under consideration, Phi(n), is generated by combining the cut sets of its children (n1 and n2) in every possible way, and adding the trivial cut {n} and retaining only cuts with up to K regular nodes and any number of parameter input nodes. The cut set of the node under consideration, Phi(n), can be formally written as Phi(n)={{n}} if n is a primary input
{{n}} U combine(Phi(n1), Phi(n2)) otherwise
with combine($A,B$)={$c1$ U $c2$|$c1$ in $A$, $c2$ in $B$,|($c1$ U $c2$)\$P$|<$K$+1} with
P the set of parameter input nodes.

Figure 8:
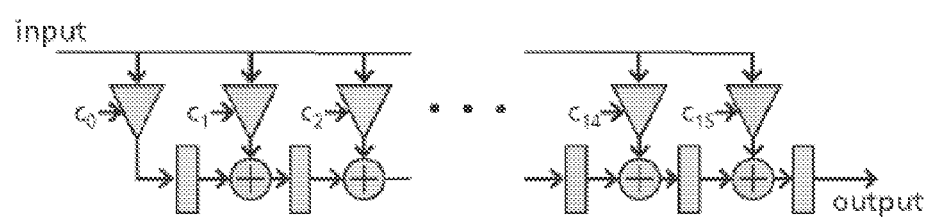
FIG. 8 schematically depicts a Finite Impulse Response Filter for use in embodiments of the present invention.

As an example of the application of methods and tools of the present invention its application will be described briefly to a filter for adaptive filtering a stream of data whereby the filter characteristic changes over time. Starting point is the generic 16-tap FIR filter, shown in FIG. 8, with 8-bit coefficients and an 8-bit input. Changing the characteristic of this filter is done by changing the 16 filter coefficients $c_i$. These 16 inputs are the parameter inputs in this example.

Figure 9:
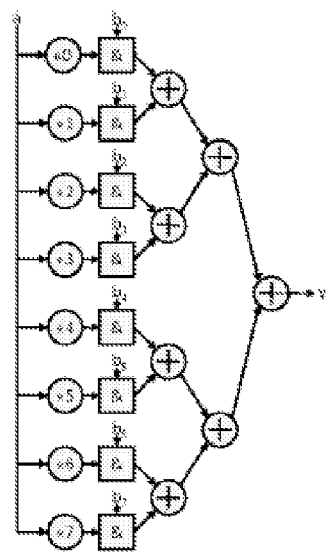
FIG. 9 schematically depicts a multiplier as a tree of ripple carry adders according to an embodiment of the present invention.

The multipliers are constructed as a tree of ripple carry adders as shown in FIG. 9. 8 shifted versions of a are created and then bitwise added with the respective bit of input b. The 8 results of this operation are added with a tree of ripple carry adders. The coefficients are connected to the a-inputs of the multipliers.

In the next step the registers are cut out of the FIR filter circuit. The register inputs and outputs are respectively seen as outputs and inputs of the remaining circuit. In this way a pure combinational circuit is obtained which is then mapped to TLUTs with the method described above. After mapping, the registers are reintroduced and a sequential TLUT circuit is obtained. This circuit is placed and routed and the tuning functions are derived.

As indicated above, the logic blocks also can be tunable connections. A tunable connection thereby may be a functional block that has any number of regular inputs, $\bar{I}=(i_0, i_1, \ldots, i_{L-1})$, any number of parameter inputs, $\bar{P}=(p_0, p_1, \ldots, p_{M-1})$ and any number of outputs, $\bar{O}(o_0, o_1, \ldots, o_{N-1})$. Each tunable connection may be associated with a Boolean function that expresses its outputs in function of its regular inputs and its parameter inputs. The functionality of a tunable connection may be of the form $$f_{TC}:\{0,1\}^L \times \{0,1\}^M \to \{0,1\}^M$$

$$(\bar{I},\bar{P}) \mapsto \overline{C}(\bar{P})\bar{I}$$

with $$\bigwedge_{n=1}^{N} \bigvee_{l=1}^{L} \bigwedge_{j \neq l} \overline{c_{nj}} \equiv 1$$

where the connection matrix $\overline{C}(\bar{P})$ is an N×L matrix of which each element is a Boolean function of the parameters inputs $\bar{P}$. The extra condition makes sure that every output only is directly connected to at most one input, a logical OR of several inputs being not allowed since this functionality cannot be realized in the routing infrastructure of conventional FPGAs.

A tunable connection may be considered a generalization of a net because it can implement any net. When a net with source i and sinks ($o_0$, $o_1$, $o_3$) is considered, this net can be implemented by a tunable connection with connection matrix $$\overline{C} = \begin{bmatrix} 1 \\ 1 \\ 1 \end{bmatrix}$$

Another example of functionality that can be implemented by a tunable connection is a 4:1 multiplexer. In this case the data inputs of the multiplexer, ($i_0$, $i_1$, $i_2$, $i_3$), are the regular inputs of the TCON and the select inputs of the multiplexer, ($s_0$, $s_1$), are the parameter inputs. The connection matrix is given by $$\overline{C}(s_0, s_1) = [\overline{s_1}\,\overline{s_0}\ \ \overline{s_1}s_0\ \ s_1\overline{s_0}\ \ s_1 s_0]$$

An example with multiple outputs is a shifter with variable shift distance. If a shifter is considered that can shift a 4-bit input, ($i_0$, $i_1$, $i_2$, $i_3$), over a distance of 0 or 1 bit selected by parameter input s. The output in the present example, ($o_0$, $o_1$, $o_2, o_3, o_4$), is 5 bits wide. The connection matrix can be given by $$\overline{C}(s) = \begin{bmatrix} \overline{s} & 0 & 0 & 0 \\ s & \overline{s} & 0 & 0 \\ 0 & s & \overline{s} & 0 \\ 0 & 0 & s & \overline{s} \\ 0 & 0 & 0 & s \end{bmatrix}.$$

A tunable connection (TCON) can also be represented in another way that is more suitable for some routing algorithms that can be used in embodiments of the present invention. The connection matrix can for example be decomposed as follows $$\overline{C}(\overline{P}) = \bigvee_{i=1}^{M} \overline{Q}_i \wedge cond_i(\overline{P})$$

where $\overline{Q}_i$ is a constant N×L matrix and $cond_i(\overline{P})$ is a Boolean function of the parameters $\overline{P}$. The matrices $\overline{Q}_i$ may be called connection patterns of the tunable connection, each of them express one way in which the outputs of the tunable connections can be connected to its inputs. The Boolean function $cond_i(\overline{P})$ associated to connection pattern i expresses the condition for which this connection pattern should be realized.

Instead of representing a connection pattern as a matrix, it can also be represented as a set of nets. A net is an ordered pair (so, SI) where so is the source, one of the inputs of the tunable connection, and SI is a set of sinks, or outputs of the Tcon.

The set of nets for a connection pattern $\overline{Q}$ can easily be found as follows: For each column c of the Q that contains at least one 1, create a net with source $i_c$. For each 1 in column c located at row r add $o_r$ to the set of sinks of the net.

By way of illustration, the following provides an example of how a (partial) parameterized configuration with parameters $\overline{P}$ is generated from a tunable circuit which has the same parameters as inputs. A Boolean function for all (or part) of the configuration bits of the FPGA is calculated.

The mapping is done in two stages: placement and routing. In the present example, the algorithms used for implementing these stages are respectively Tplace and Troute, which are adapted versions of conventional algorithms used in conventional mapping.

The placing algorithm Tplace uses simulated annealing to associate every tunable LUT (TLUT) in the tunable circuit with a physical LUT on the FPGA. Afterwards, the routing algorithm Troute implements the tunable connections in the FPGA's interconnection network using an adapted version of a pathfinder algorithm. Both algorithms differ from their conventional counterparts in that they have to handle tunable connections (TCONs) instead of nets. In the placing algorithm Tplace a novel cost function is used to estimate the routing resources that will be needed to route the tunable connections using routing algorithm TRoute. The routing algorithm Troute routes tunable connections instead of nets. In the following, these new routing and placing algorithms are described in more detail. First, the routing algorithm Troute is discussed.

In the routing algorithm, also referred to as the Pathfinder algorithm, the routing architecture is represented as a directed graph, called the circuit graph. Because the circuit graph can easily be changed, the routing algorithm Pathfinder can be easily adapted to virtually any programmable logic device architecture. The routing resources in a programmable logic device such as e.g. an FPGA architecture and their connections are represented as a directed graph G=(V,E), called the circuit graph. The vertices V in the graph represent the routing resources: the wires and the ports of the logic blocks. The directed edges (t, h) are used to represent the switches and multiplexers in the routing architecture. t is called the tail of the edge and h is called the head of the edge. There are two types of port vertices: sources and sinks. Sources represent output ports of the physical architecture while sinks represent input ports of the physical architecture. If two wires $wire_a$ and $wire_b$ are considered, these can be respectively represented in the circuit graph by vertices $node_a$ and $node_b$. A unidirectional switch connecting $wire_a$ to $wire_b$ is a switch that when closed forces the logic value forced on $wire_a$ to $wire_b$. Such a switch is represented by a directed edge ($node_a$, $node_b$). A bidirectional switch connecting $wire_a$ to $wire_b$ is a switch that when closed transfers the logic level of $wire_a$ to $wire_b$ when a logic level is forced on $wire_a$ or vica versa when a logic level is forced on $wire_b$. Such a switch is represented by two directed edges: ($node_a$, $node_b$) and ($node_b$, $node_a$). A multiplexer connecting n input wires $wire^i_a$ to an output wire $wire_b$ is represented by n edges ($node^i_a$, $node_b$).

A net n is an ordered pair (so, SI) containing a source so and a set of sinks SI. A subgraph R of the circuit graph is called a routing of a net n=(so, SI) if it is the union of a set of paths that connect the source so to each of the sinks $si_i$.

In the conventional mapping problem the circuit is represented by using two kinds of blocks: logic blocks and connections blocks. Both of these blocks contain input ports and/or output ports. The connection has one input port and any number of output ports. Each of the logic blocks belongs to a type of logic blocks. Each type has a specific number of input ports and a specific number of output ports. The types are each associated with a kind of physical logic resource blocks available on the target device. In a simple architecture there is only one kind of logic resource block, e.g. 4-input LUTs. The ports of blocks in the circuit representations are connected using one to one connections. Every connection connects a logic block output port to a connection block input port or a connection block output port to a logic block input port.

In this example, the logic blocks represent a piece of logic that needs to be implemented on the device. A connection block represents a connection that needs to be made between the logic block output port connected to its input port, its source port, and the logic block input ports connected to its output ports, its sink ports.

Routing is done after placement. During placement each of the abstract logic blocks is associated with a physical logic block of its type. In the conventional routing problem, one wants to calculate the Boolean values for the configuration memory bits that control the switches in the interconnect network so that the connections represented by each of the connection blocks are realized simultaneously.

Using the circuit graph, routing a connection block n in circuit representation is done by first finding the nodes in the graph associated to its source port $source_{node}$ and each of the sinks $sink^i_{node}$. A routing for connection block n can then be found by selecting one of the subgraphs of the circuit graph that contain: the source node $source_{node}$, all of the sink nodes $sink^i_{node}$ and no other nodes that represent physical ports. The subgraph should also contain paths form the source $source_{node}$ to each of the sinks $sink^i_{node}$. Routing a full circuit involves finding a subgraph for each of the connection blocks in the circuit representation, so that no two subgraphs have nodes or vertices in common.

In the routing algorithm TRoute the problem is different because we now have to route tunable connection blocks (TCONs) instead of fixed connection blocks. As described above, a tunable connection has any number of input ports (the nodes associated to the logic block output ports connected to these input ports are called the TCON's sources) and any number of output ports (the nodes associated to the logic block input ports connected to these output ports are called the TCON's sinks). Each tunable connection block TCON is associated with a set of connection patterns, one for each of the allowed parameter value sets. A connection pattern describes one way of connecting the output ports of the tunable connection block TCON to its input ports. The pattern is described as a set of nets. A net contains one input port and a set of output ports. To avoid short circuits of the input ports the output port sets of the nets in one connection pattern should be disjoint (in the logic representation this is achieved with the extra condition).

Routing a full tunable circuit now involves finding a subgraph for each of the tunable connection blocks TCONs (TCON graph), so that no two subgraphs have nodes or vertices in common while minimizing some cost function. These TCON graphs should have the property that for each of their connection patterns the TCON graph should contain a subgraph, a pattern graph that realizes the connections represented by the connection patterns. This means that for each of the nets in a pattern the pattern graph contains a subgraph (disjoint of other net graph) that contains the source of that net and the sinks of that net. This subgraph should also contain a path from the source to all of the sinks.

In the basic routing algorithm Pathfinder algorithm, known from prior art, each of the nodes n in the circuit graph is associated with three costs: the base cost $b_n$, the history cost $h_n$ and the present sharing cost $p_n$. The total cost of using a node $c_n$ is given by $$c_n = b_n \cdot h_n \cdot p_n$$

The present sharing cost of a node n is calculated in the following way $$p_n = 1 + \max(0, p_{fac} \cdot (\text{occupancy}(n) + 1 - \text{capacity}(n)))$$

where the occupancy(n) is the number of nets that share node n and capacity(n) is the maximum number of nets that can share node n. In our cases capacity(n)=1, but in more extended circuit graph representations certain nodes can have a higher capacity.

The history cost depends on the iteration i of the algorithm. It is calculated in the following way.

$$h_n^i = \begin{cases} 1 & \text{if } i = 1 \\ h_n^{i-1} + \max(0, h_{fac}, (\text{occupancy}(n) - \text{capacity}(n))) & \text{if } i > 1 \end{cases}$$

The basic structure of the Pathfinder algorithm as known from prior art is given in FIG. 11. The main loop, called the negotiated congestion loop, is repeated until no resources in the circuit graph are shared between routings of the nets in the circuit. In each iteration, this loop takes two steps. First, one loops over all nets in the circuit. Each net is ripped up, rerouted and the present sharing cost is updated according to the new routing. Second, the history costs associated to the nodes are updated. It is assumed that the routing algorithm routeNet(n) finds the lowest cost routing for net n. In that case the present sharing cost makes sure that routings for different nets try to avoid each other. The history cost makes sure that congested resources get more expensive in every iteration so that less important nets will avoid these resources eventually. The conventional routing algorithm shown here is based on Dijkstra's shortest-path graph algorithm (Dijkstra, Numerische Mathemtik 1, 269-271 (1959)) except that one calculates the cost of a path as the sum of the costs of the vertices in that path while the original algorithm summed the costs of the edges in the path. An example of a pseudo code for routing a net can be found in FIG. 12.

The new routing algorithm TRoute also uses a negotiated congestion loop, an example thereof being shown in FIG. 13. The difference is that the loop now iterates over all tunable connections TCONs in the circuit representation instead of looping over nets. If the present sharing cost and the history cost are calculated in the same way as in conventional routing algorithm Pathfinder and if a TCON router is selected that finds (almost) minimum cost routings for a tunable connection TCON, this algorithm will converge to a solution where no two tunable connection TCON routings have resources in common.

The most important change lies in the TCON router. An example of a pseudo code for an exemplary TCON router is given in FIG. 14. In order to route TCONs it is needed to extend the cost function of the circuit graph nodes slightly. The new cost function is $$c_n = \begin{cases} \infty & \text{if } usedInPattern \\ 0 & \text{if } usedInTcon \wedge notUsedInPattern \\ b_n \cdot h_n \cdot p_n & \text{if } notUsedInTcon \wedge notUsedInPatter \end{cases}$$

This new cost function ensures two things. The first case makes sure that when several nets are routed in one pattern of the TCON that these nets cannot overlap. This ensures that a valid routing for the pattern is found in one go. One could of course use an iterative process similar to the original pathfinder where one gradually makes the cost for overlapping nodes more expensive. This could lead to better results, but would also increase the complexity of the algorithm and the execution time of the algorithm. The second case makes nodes that are used in a previously routed pattern of costless. This ensures that different patterns of the same TCON try to overlap as much as possible, thus reducing the final cost of the TCON routing.

Figures 15, 16, 17:
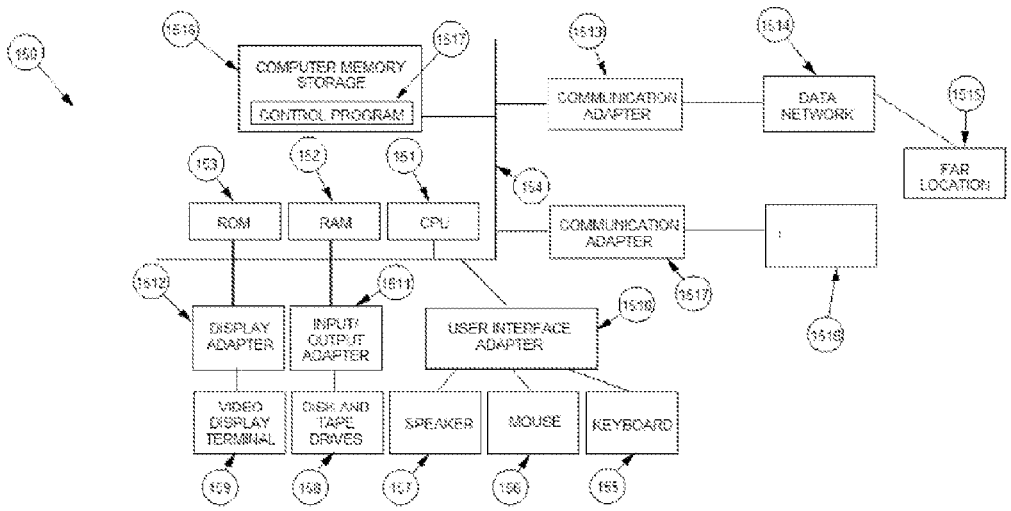
FIG. 15 schematically depicts a computer system for use with an embodiment of the present invention.
FIG. 16 illustrates Table 1 which is an example of the required resources, TLUTs, wires and the channel width for three different implementations of a 32×1 multiplexer.
FIG. 17 illustrates Table 2 which is an example of the required resources, TLUTs, wires and the channel width for three different implementations of a 64×1 multiplexer.

The present invention also provides tools for implementing the above methods. The tools may comprise software in the form of a computer program or in the form of program modules, each module carrying out a particular task. Some of the modules may be conventional and may interface with modules implementing novel aspects of the present invention. The software may be adapted to run on a suitable computer or computing platform based on one or more microprocessors such as a Pentium processor supplied by the Intel Corp. USA. It may be adapted for use with any suitable operating system such as Windows 2000, XP, Vista, etc. as supplied by Microsoft Corp. USA or the Linux operating system, etc. FIG. 15 is a schematic representation of a computing system which can be utilized with the methods and in a system according to the present invention. A computer 150 is depicted which may include a video display terminal 159, a data input means such as a keyboard 155, and a graphic user interface indicating means such as a mouse 156. Computer 150 may be implemented as a general purpose computer, e.g. a UNIX workstation or a personal computer.

Computer 150 includes a Central Processing Unit ("CPU") 151, such as a conventional microprocessor of which a Pentium processor supplied by Intel Corp. USA is only an example, and a number of other units interconnected via bus system 154. The bus system 154 may be any suitable bus system—FIG. 11 is only schematic. The computer 150 includes at least one memory. Memory may include any of a variety of data storage devices known to the skilled person such as random-access memory ("RAM"), read-only memory ("ROM"), non-volatile read/write memory such as a hard disc as known to the skilled person. For example, computer 150 may further include random-access memory ("RAM") 152, read-only memory ("ROM") 153, as well as a display adapter 1512 for connecting system bus 154 to a video display terminal 159, and an optional input/output (I/O) adapter 1511 for connecting peripheral devices (e.g., disk and tape drives 158) to system bus 154. Video display terminal 159 can be the visual output of computer 150, which can be any suitable display device such as a CRT-based video display well-known in the art of computer hardware. However, with a desk-top computer, a portable or a notebook-based computer, video display terminal 159 can be replaced with a LCD-based or a gas plasma-based flat-panel display. Computer 150 further includes user interface adapter 1510 for connecting a keyboard 155, mouse 156, optional speaker 157. The relevant data describing a circuit to be optimized, at least a Boolean function and a set of parameter arguments, may be input directly into the computer using the keyboard 155 or from storage devices such as 158, after which a processor carries out a method in accordance with the present invention. The results of the method may be transmitted to a further near or remote location, e.g. an FPGA processing facility to complete an FPGA configuration in accordance with the details provided by computer 150.

An FPGA processing facility 1516 may also be connected via a communications adapter 1517 to bus 154 connecting computer 150 to a data network such as the Internet, an Intranet a Local or Wide Area network (LAN or WAN) or a CAN. For example, the facility 1516 may receive TLUT data directly from computer 150 running a computer program in accordance with the present invention or data derived from such an output of computer 150. Alternatively, the facility 1516 may receive the TLUT data indirectly on a suitable signal storage medium such as a diskette, a replaceable hard disc, an optical storage device such as a CD-ROM or DVD-ROM, a magnetic tape or similar.

Computer 150 also includes a graphical user interface that resides within machine-readable media to direct the operation of computer 150. Any suitable machine-readable media may retain the graphical user interface, such as a random access memory (RAM) 152, a read-only memory (ROM) 153, a magnetic diskette, magnetic tape, or optical disk (the last three being located in disk and tape drives 158). Any suitable operating system and associated graphical user interface (e.g., Microsoft Windows, Linux) may direct CPU 151. In addition, computer 150 includes a control program 1517 that resides within computer memory storage 1516. Control program 1517 contains instructions that when executed on CPU 151 allow the computer 150 to carry out the operations described with respect to any of the methods of the present invention.

Those skilled in the art will appreciate that the hardware represented in FIG. 15 may vary for specific applications. For example, other peripheral devices such as optical disk media, audio adapters, or chip programming devices, such as PAL or EPROM programming devices well-known in the art of computer hardware, and the like may be utilized in addition to or in place of the hardware already described.

A tool in accordance with an embodiment of the present invention may be provided as a software product that comprises a computer program having code segments, which when executed on a computing device execute a method for generating a part or a complete parameterized configuration for a programmable logic device from a Boolean function and a set of parameter arguments, comprising: a) generating a tunable circuit from the Boolean function and from at least one parameter argument, and b) generating the part or complete parameterized configuration for a programmable logic device from the tunable circuit. The latter coded step includes mapping the tunable circuit to the programmable logic device or to a programmable logic device architecture. The computer code may be adapted, when executed on computing device, aa) to calculate a tuning function that comprises a functionality of a part of the Boolean function that is implementable in the tunable logic block. The code may be adapted so that the step aa) comprises recognizing a pattern in the Boolean function, expressing the corresponding functionality in the respective tunable logic block and calculating the tuning function corresponding to that functionality.

Code may be provided such that, when executed on a computing device, the following steps are executed:
aa') representing the Boolean function as a directed acyclic graph, wherein a node represents a logic gate, an input signal, a parameter input signal and/or an output signal,
ab') marking all nodes comprising parameter input signals,
ac') folding the marked nodes having a non-marked successor into the successor and duplicating the marked nodes with multiple fanouts, and
repeating the ac') step until no marked nodes are left.

The code may also execute a method wherein the step b) comprises the steps ba) generating a master configuration (5) for configuring the programmable logic device at startup, and bb) evaluating the tuning functions (6) being used by a configuration manager at run-time.

The code may be provided so that when the tunable logic block comprises at least one logic block with at least one data input signal and/or at least one select input signal, each combination of values of the at least one select input signal is coupled with at least one data input signal and wherein the value of the output signal of the logic block is equal to the value of the at least one data input signal coupled to the combined value of the at least one select input signal.

In the example depicted in FIG. 15, the computer program product for carrying out any method of the present invention can reside in any suitable memory. However, it is important that while the present invention has been, and will continue to be, that those skilled in the art will appreciate that the mechanisms of the present invention are capable of being distributed as a computer program product in a variety of forms, and that the present invention applies equally regardless of the particular type of signal bearing media used to actually carry out the distribution. Examples of computer readable signal bearing media include: recordable type media such as floppy disks and CD ROMs and transmission type media such as digital and analogue communication links.

Accordingly, the present invention also includes a software product which when executed on a suitable computing device carries out any of the methods of the present invention. Suitable software can be obtained by programming in a suitable high level language such as C and compiling on a suitable compiler for the target computer processor.

In one aspect, the present invention also relates to a device comprising a programmable logic device and a configuration manager for configuring the programmable logic device at run-time. The device can e.g. be made using the methods as described above. The configuration manager may be adapted for evaluating a part of or a complete parameterized configuration and reconfiguring the programmable logic device. The configuration manager thus may be adapted for generating a particular configuration based on a set of parameters and on a part of or a complete parameterized configuration for the programmable logic device based on a circuit description comprising at least one logic block having at least one parameter input and based on a Boolean function and a set of parameter arguments. The configuration manager thereby may be adapted for using circuit descriptions wherein the at least one logic block is at least one tunable logic block representing a LUT, a connection or a combination thereof. Examples of such devices may for example be a router, a device for DNA aligning, a software defined radio, an adaptive filtering device, adaptive neural networks, adaptive image processing devices, adaptive target recognition devices, etc. All these devices have in common that, by using our technique, less resources are needed to implement them and their performance is better.

By way of illustration, the present invention not being limited thereby, the methods and systems are illustrated for an exemplary application of a multiplexer. Several implementations of a 32 to 1 multiplexer and a 64 to 1 multiplexer are illustrated. Implementations of such a multiplexer are shown for a conventional design, for a design using TLUTs and a for a design using TCONs. As also already indicated above, mixing of the use of TLUTs and TCONs also may be performed, e.g. to make a trade-off between efficiency and functionality. In the present example, the TCON implementation provides the best results but in general there may be parts of the functionality that cannot be implemented with TCONs (because they do not oblige to the TCON constraint described above) and for these parts a TLUT implementation may be used. Also, for some functionalities the trade-offs may be in favour of TLUTs instead of TCONs. A combination of functionalities that are better suited for TCONs and functionalities that are better suited for TLUTs therefore needs a mixture of both.

A multiplexer is a logic circuit with a number of data inputs $\bar{I}=(i_0, i_1, \ldots i_N)$, in the present example N equaling 32 or 64 respectively, with an output and with a number, $\log_2(N)$, of selected signals $\bar{S}=(s_0, s_1, \ldots, s_{\log_2(N)-1})$. The selected signals indicate which of the data inputs is connected to the output. A multiplexer therefore can be seen as controllable routing. If the select signals are chosen as parameters, the multiplexer can be fully embedded in the routing fabric of an FPGA or another programmable logic device (PLD).

A simple target architecture with a configurable logic block that contains only one 4-input LUT followed by a flip flop is used. The flip flop can be bypassed if not used, e.g. by setting a configuration bit. In none of the crossbar designs of the present example the flip flops are used. In the routing implementation, the simple architecture used is an architecture using only wires that stretch one configurable logic block.

The examples comprise three different implementations of the multiplexer:
An implementation without using reconfiguration. This is the conventional way of implementing this kind of circuitry on an FPGA. The implementation is used as a reference for the other implementations. For this implementation, the synthesis tool Quartus from Altera corporation is used for synthesis of the multiplexer circuit starting from a VDHL description. Afterwards, the ABC technology mapper (called "fpga") is used to map the circuit to 4-input LUTs. The result is then placed and routed using the routability-driven placement and routing of the VPR tool.

An implementation whereby only TLUTs are used in the tunable circuit and whereby thus no TCONs are used. For this implementation, Quartus is used to do the synthesis and the TMAP algorithm is used to map the circuit to TLUTs. The select inputs of the multiplexer are selected as parameters. The static LUT circuit derived from the TLUT circuit is then placed and routed using the routability driven placement and routing of VPR.

An implementation whereby only TCONs are used in the tunable circuit and whereby thus no TLUTs are used. The tunable circuit is manually designed and in this example contains one TCON to implement the multiplexer. The connection matrix of the 32 to 1 multiplexer is a 1×32 matrix, in the present example given by $$\overline{C_{max32}}(s_0, s_1, s_2, s_3, s_4) = [\overline{s_4 s_3 s_2 s_1 s_0} \ \overline{s_4 s_3 s_2 s_1} s_0 \ \overline{s_4 s_3 s_2} s_1 \ \overline{s_0} \ldots s_4 s_3 s_2 s_1 s_0]$$

The connection matrix of the 64 to 1 multiplexer is a 1×64 matrix in the present example given by $$\overline{C_{max64}}(s_0, s_1, s_2, s_3, s_4, s_5) = [\overline{s_5 s_4 s_3 s_2 s_1 s_0} \ \overline{s_5 s_4 s_3 s_2 s_1} s_0 \ \overline{s_5 s_4 s_3 s_2 s_1 s_0} \ldots s_5 s_4 s_3 s_2 s_1 s_0]$$

These tunable circuits are then mapped to the FPGA architecture with an adapted version of the VPR routability-driven placement and routing algorithm as described above.

The results for the three implementations for both the 32 to 1 multiplexer and the 64 to 1 multiplexer are shown in Table 1 and Table 2 respectively. The resources, the number of LUTs and the number of wires required to implement the multiplexers in the FPGA architecture were measured. Furthermore, the minimum channel width, i.e. the number of wires between two CLB's needed to route the circuit are measured. The minimum channel width gives an indication how the circuit strains the routing fabric.

From the results it is clear that the implementation using TCONs is the best. It uses no LUTs and about five times less wires then the conventional implementation. It can also be seen, from the channel width, that the TCON implementation strains the routing fabric the least. It can also be seen that the algorithm using configurable LUTs also results in a significant advantage over the conventional configuration. Based on the above example, it can be seen that implementing logic blocks that can be expressed as tunable connections in the routing system results in more efficient implementation. Nevertheless, in view of functionality restrictions imposed in some applications, sometimes not all logic blocks can be mapped to tunable connections. It therefore may be advantageous of embodiments of the present invention that as much as possible logic blocks can be implemented as tunable connections and that the remaining logic blocks can be implemented as tunable look up tables. The tunable look up tables thereby have no restrictions to the logic they can implement.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

The invention claimed is:
1. A method for generating a part or a complete parameterized configuration for a programmable logic device from a Boolean function and a set of parameter arguments, comprising the following steps:
a) generating, using a computer, a circuit description comprising at least one logic block having at least one parameter input, wherein the circuit description is generated from the Boolean function and from at least one parameter argument, and b) generating a part of or a complete parameterized configuration for the programmable logic device from the circuit description, the parameterized configuration being a configuration for the programmable logic device in which some of the configuration bits are expressed as a function of a set of parameters.

2. The method according to claim 1, wherein step b) includes mapping the circuit description to the programmable logic device.

3. The method according to claim 1, wherein step a) comprises
   aa) decomposing the Boolean function so that each decomposition function is implementable by conversion of a logic block having at least one parameter input or by a regular logic block, at least one of those decomposition functions being implemented by conversion of a logic block having at least one parameter input.

4. The method according to claim 3, wherein at least one of the decomposition functions being implementable by conversion of a logic block having at least one parameter input represents a look up table.

5. The method according to claim 3, wherein step aa) comprises the steps:
   aaa) representing the Boolean function as a directed acyclic graph, wherein a node represents a logic gate, an input signal, a parameter input signal or an output signal,
   aab) calculating a subgraph covering of the directed acyclic graph so that the functionality associated with every subgraph can be implemented by a logic block or by conversion of a logic block having at least one parameter input, and
   aac) retrieving the functional decomposition from the subgraph covering.

6. The method according to claim 5, wherein step aab) comprises the steps:
   aaba) marking the nodes tht are only dependent on parameter inputs,
   aabb) folding the marked nodes having a non-marked successor into the successor and duplicating the marked nodes with multiple fanouts, and
   repeating the aabb) step until no marked nodes are left.

7. The method according to claim 3, wherein the at least one of the decomposition functions being implementable by conversion of a logic block having at least one parameter input represents a connection.

8. The method according to claim 7, comprising routing by generating a subgraph for each of the logic blocks having at least one parameter input and representing a connection so that no two subgraphs have common nodes.

9. The method according to claim 1, wherein the step b) comprises the steps:
   ba) removing the parameter inputs and the associated connections from the circuit description so that the remaining circuit can be further treated as if it was a regular logic block circuit
   bb) implementing the resulting circuit of regular logic blocks on the target PLD, and
   bc) inserting the Boolean functions of a set of parameters in the configuration.

10. The method according to claim 1, wherein the step b) comprises the steps:
    ba) generating a master configuration for configuring the programmable logic device at startup, and
    bb) extracting the Boolean functions of a set of parameters being used by a configuration manager at run-time.

11. The method according to claim 1, wherein the circuit description comprises at least one logic block having at least one parameter input with at least one data input signal and/or at least one select input signal, wherein each combination of values of the at least one select input signal is coupled with at least one data input signal and wherein the value of the output signal of the logic block is equal to the value of the at least one data input signal coupled to the combined value of the at least one select input signal.

12. A design tool for generating a part of or a complete parameterized configuration for a programmable logic device from a Boolean function and a set of parameter arguments, the tool comprising:
    a) first means for generating a circuit description comprising at least one logic block having at least one parameter input, wherein the circuit description is generated from the Boolean function and from at least one parameter argument, and
    b) second means for generating the part of or a complete parameterized configuration from the circuit description, the parameterized configuration being a configuration for a programmable logic device in which some of the configuration bits are expressed as a function of a set of parameters.

13. The tool of claim 12, wherein the second means has means for mapping the circuit description to the programmable logic device.

14. The tool according to claim 12, wherein the first means for generating includes:
    aa) means for calculating a Boolean function of a set of parameters that comprises a functionality of a part of the Boolean function that is implementable in the logic block having at least one parameter input.

15. The tool according to claim 14, wherein the means for calculating a Boolean function of a set of parameters includes means for recognizing a pattern in the Boolean function expressing the corresponding functionality in the respective logic block and calculating the Boolean function of a set of parameters corresponding to that functionality.

16. The tool according to claim 12, wherein the first means for generating comprises:
    aa') means for representing the Boolean function as a directed acyclic graph, wherein a node represents a logic gate, an input signal, a parameter input signal and/or an output signal,
    ab') means to allow marking of all nodes comprising parameter input signals,
    ac') means to allow folding of the marked nodes having a non-marked successor into the successor and duplicating the marked nodes comprising multiple fanouts, and
    ad') means for repeating folding of the marked nodes until no marked nodes are left.

17. The tool according to claim 12, wherein the means for mapping comprises:
    ba) second means for generating a master configuration for configuring the programmable logic device at startup, and
    bb) means for evaluating the tuning functions to be used by a configuration manager at run-time.

18. The tool according to claim 12, wherein the tunable logic block comprises: at least one logic block with at least one data input signal and/or at least one select input signal, wherein each combined value of the at least one select input signal is coupled with at least one data input signal and wherein the value of the output signal of the logic block is equal to the value of the at least one data input signal coupled to the combined value of the at least one select input signal.

* * * * *